United States Patent
Choi et al.

(10) Patent No.: US 6,876,585 B2
(45) Date of Patent: Apr. 5, 2005

(54) CIRCUIT AND METHOD FOR SELECTING REFERENCE VOLTAGES IN SEMICONDUCTOR MEMORY DEVICE

(75) Inventors: Jong-Hyun Choi, Kyounggi-do (KR); Jae-Hoon Kim, Kyounggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/612,593

(22) Filed: Jul. 1, 2003

(65) Prior Publication Data
US 2004/0004876 A1 Jan. 8, 2004

(30) Foreign Application Priority Data
Jul. 2, 2002 (KR) ........................................ 2002-38009

(51) Int. Cl.[7] ............................................. G11C 11/34
(52) U.S. Cl. ................................ 365/189.09; 365/226
(58) Field of Search ............................ 365/189.09, 226

(56) References Cited

U.S. PATENT DOCUMENTS

| | | | | |
|---|---|---|---|---|
| 4,792,749 A | * | 12/1988 | Kitagawa et al. | ........... 323/314 |
| 5,426,616 A | * | 6/1995 | Kajigaya et al. | ............ 365/226 |
| 5,818,257 A | * | 10/1998 | Villa | ........................... 326/81 |
| 6,097,180 A | | 8/2000 | Tsukude et al. | ............ 323/313 |
| 6,326,834 B1 | | 12/2001 | Akita et al. | ................. 327/536 |
| 6,333,864 B1 | | 12/2001 | Nishimura et al. | ........... 363/78 |

* cited by examiner

*Primary Examiner*—M. Tran
(74) *Attorney, Agent, or Firm*—Marger Johnson & McCollom

(57) ABSTRACT

A circuit and method for selecting reference voltages in a semiconductor memory device, in which an internal voltage or a high voltage can be changed by use of a plurality of reference voltage generators therewith, so as to enable the selection of mutually different reference voltages. In one embodiment, the circuit comprises a plural number of reference voltage generators for generating first and second reference voltages; an internal voltage generator for receiving the first or second reference voltage, and generating an internal voltage of a constant level; and a high voltage generator for receiving and boosting the first or second reference voltage, and generating the high voltage VPP of a given level. In such construction, one reference voltage out of the first and second reference voltages is selected and input to the high voltage generator, and one reference voltage out of the first and second reference voltages is selected and input to the internal voltage generator, in response to a reference voltage selection signal supplied to the device.

16 Claims, 4 Drawing Sheets

CIRCUIT AND METHOD FOR SELECTING REFERENCE VOLTAGES IN SEMICONDUCTOR MEMORY DEVICE

BACKGROUND OF THE INVENTION

1. Field of the Invention

The present invention relates to a reference voltage selecting circuit of a semiconductor memory device; and more particularly, to a circuit and a method for selecting reference voltage in a semiconductor memory device, in which an internal voltage and/or high voltage can be changed using a plurality of reference voltage generators and circuitry to select different reference voltage combinations in a semiconductor memory device.

2. Prior Art of the Invention

Recent semiconductor memory devices use an internal voltage generating circuit for receiving an external voltage source and then generating an internal voltage lower than the exterior voltage source in order to get low voltage and low consumption of electric power. For instance, in a semiconductor memory device such as an EDO DRAM, the internal voltage generating circuit serves a role of dropping a 3.3V external voltage source to a 2.8V internal voltage source.

In such semiconductor memory devices, the internal voltage generating circuit drops the voltage level of an external power supply to a lower voltage level for use as an internal power supply. The internal voltage generating circuit not only ensures that a stabilized power supply voltage is presented to the chip internal circuits when the external voltage source fluctuates, but also actively responds to temperature or processing condition fluctuations, thereby guaranteeing constant chip performance.

FIG. 1 is a block diagram of a conventional semiconductor memory device showing a connection relation among voltage generators for generating an internal voltage and a high voltage.

A reference voltage generator 10 receives an external voltage (EVC), generates a given reference voltage VREF, and applies it to an internal voltage generator 12. The internal voltage generator 12 receives reference voltage VREF, generates an internal voltage (IVC) having a constant level, and applies it to a memory cell array area or to a peripheral area. A high voltage generator 14 receives and boosts reference voltage VREF, generates a high voltage VPP having a given level, and applies it as a word line gate voltage. When the high voltage VPP is increased, current consumption and speed increase. Conversely, when the high voltage VPP is decreased, current consumption and speed decrease.

In such semiconductor memory devices, in order to execute a memory cell test, promote the speed of the semiconductor memory device, or lessen current consumption, the internal voltage source IVC or high voltage VPP voltage level should be changed. To change the internal voltage or the high voltage, the reference voltage VREF should be changed.

In such semiconductor memory devices, however, since the reference voltage VREF output from the reference voltage generator 10 is used in common to generate the internal voltage IVC and the high voltage VPP, the internal voltage IVC or the high voltage VPP cannot be changed to perform the memory cell test, promote the speed of the semiconductor memory device, or reduce current consumption.

Since the reference voltage VREF for internal voltage IVC and high voltage VPP are the same, the internal voltage IVC and the high voltage VPP are generated in an interlocking state, making it is impossible to separately change the internal voltage source IVC and the high voltage VPP.

SUMMARY OF THE INVENTION

Therefore, it is an object of the present invention to provide a circuit and method for selecting reference voltages in a semiconductor memory device that is capable of selectively supplying a plurality of reference voltages and separately changing the voltage levels for an internal voltage source IVC and a high voltage VPP.

Another object of the present invention is to provide a circuit and method for selecting reference voltages in a semiconductor memory device that is capable of generating a voltage source IVC and high voltage corresponding to reference voltages selected among a plurality of reference voltages.

In accordance with an embodiment of the present invention, in a circuit for selecting reference voltages in a semiconductor memory device, composed of an internal voltage generator for receiving the reference voltage and generating an internal voltage of a constant level, and having a high voltage generator for receiving and boosting the reference voltage and generating a high voltage of a given level; a first reference voltage generator to generate a first predetermined reference voltage, from a supplied external voltage; a second reference voltage generator to generate a second predetermined reference voltage, from the supplied external voltage; a controller to output first and second reference voltage switching selection signals, to select the reference voltage in response to a reference voltage selection signal supplied to the device; a first switch to supply the first reference voltage to the high voltage generator in response to the first reference voltage switching selection signal; a second switch to supply the second reference voltage to the high voltage generator in response to the second reference voltage switching selection signal.

Also, in accordance with an embodiment of the present invention, a circuit for selecting reference voltages in a semiconductor memory device having an internal voltage generator for receiving the reference voltage and generating an internal voltage source of constant level, and having a high voltage generator for receiving and boosting the reference voltage and generating a high voltage of a given level; a first reference voltage generator to generate a first predetermined reference voltage from a supplied external voltage; a second reference voltage generator to generate a second predetermined reference voltage from the supplied external voltage; a controller to output first and second reference voltage switching selection signals, to select the reference voltage in response to a reference voltage selection signal supplied to the device; a first switch to supply the first-reference voltage to the internal voltage generator in response to the first reference voltage switching selection signal; and a second switch to supply the second reference voltage to the internal voltage generator in response to the second reference voltage switching selection signal.

In accordance with another embodiment of the present invention, a circuit for selecting reference voltages in a semiconductor memory device is made up of an internal voltage generator for receiving reference voltage and generating an internal voltage of a constant level; a high voltage generator for receiving and boosting the reference voltage and generating a high voltage of a given level; a first reference voltage generator to generate a first predetermined reference voltage from a supplied external voltage; a second reference voltage generator to generate a second predetermined reference voltage from the supplied external voltage; a controller to output first through fourth switching selection signals to select the first or second reference voltage in response to a reference voltage selection signal supplied to the device; a first switch to supply the first reference voltage to the internal voltage generator in response to the first switching selection; a second switch to supply the second reference voltage to the internal voltage generator in response to the second switching selection signal; a third switch to supply the first reference voltage to the high voltage generator in response to the third switching selection signal; and a fourth switch to supply the second reference voltage to the high voltage generator in response to the fourth switching selection signal.

In accordance with a more specific embodiment of the present invention, the controller receives the reference voltage selection signal through a pad.

In the alternative, the controller receives the reference voltage selection signal through a fuse option circuit.

In accordance with a method embodiment of the present invention, a method of selecting reference voltages in a semiconductor memory device, the semiconductor memory device having a plurality of reference voltage generators for generating first and second reference voltages, having an internal voltage generator for receiving first or second reference voltages and generating an internal voltage source based on a constant level, and having a high voltage generator for receiving and boosting first or second reference voltage and generating a high voltage of a given level, and the method comprises the step of:

selecting one reference voltage out of the first and second reference voltages is input to the high voltage generator in response to the reference voltage selection signal supplied to the device.

BRIEF DESCRIPTION OF THE DRAWINGS

The above and other objects and features of the instant invention will become apparent from the following description of preferred embodiments taken in conjunction with the accompanying drawings, in which.

PREFERRED EMBODIMENTS OF THE INVENTION

Hereinafter, preferred embodiments of the present invention will be described in detail with reference to the accompanying drawings.

It will be understood by those skilled in the art that the present invention can be embodied by numerous different types and is not limited to the following described embodiments. The following various embodiments are exemplary in nature, it is noted that voltage references, voltage generators, and the like are well-known in the art. Accordingly, details of such circuitry have been omitted so that the invention can be clearly presented.

Figure 1:
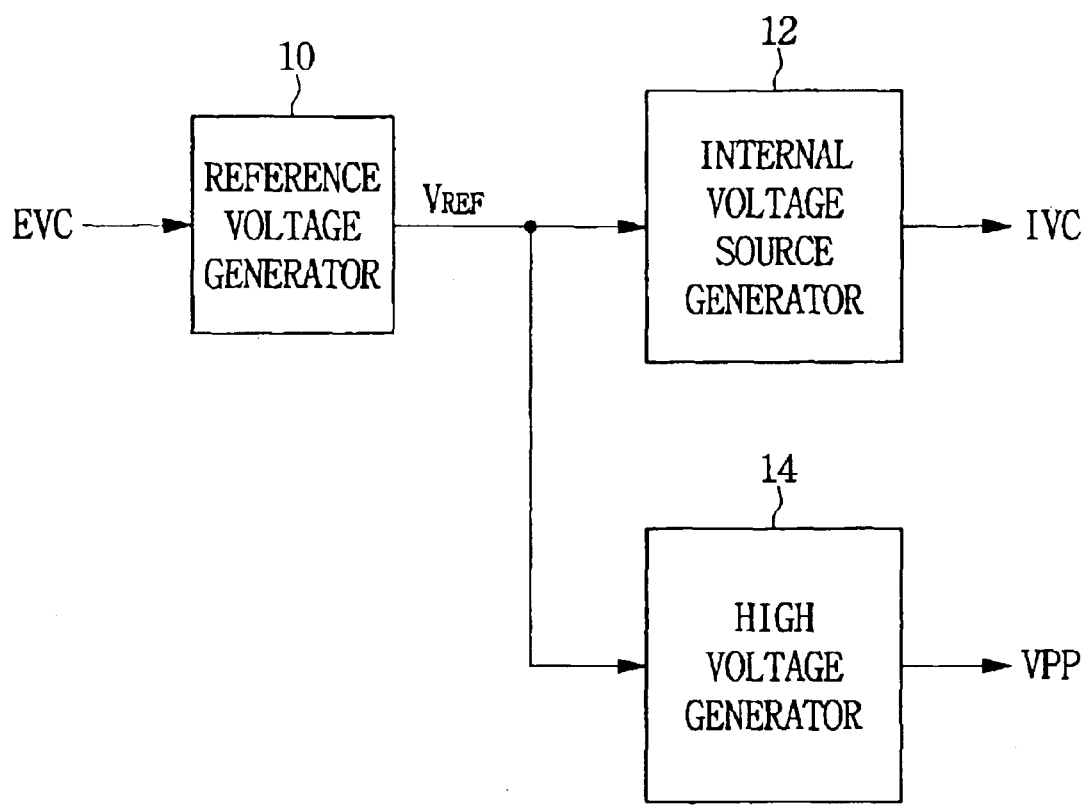
FIG. 1 is a block diagram showing a connection relation among voltage generators for generating an internal voltage and a high voltage in a conventional semiconductor memory device.
Figure 2:
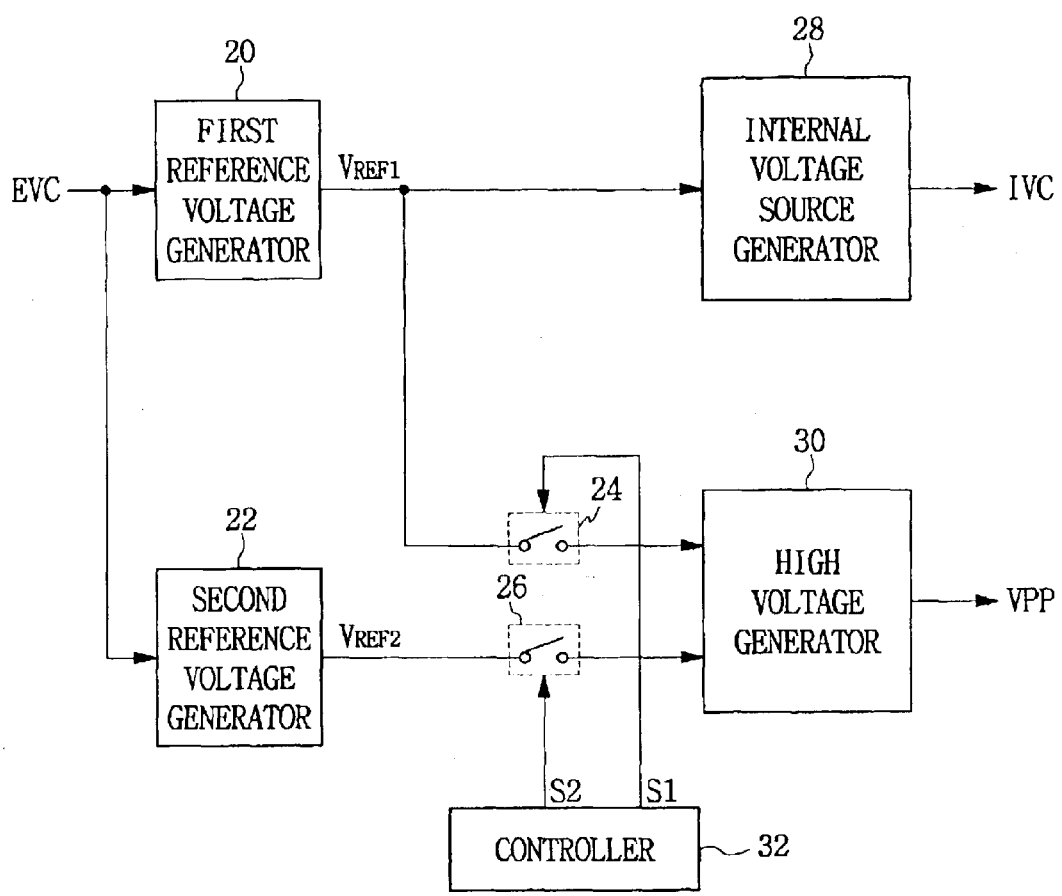
FIG. 2 is a circuit diagram of a circuit for generating an internal voltage and a high voltage in a semiconductor memory device in a first preferred embodiment of the present invention.

FIG. 2 represents a circuit diagram of a circuit for generating an internal voltage and a high voltage in a semiconductor memory device in one embodiment of the present invention.

In accordance with the first embodiment, the circuit in FIG. 2 includes: a first reference voltage generator 20 that receives an external voltage EVC, and generates and outputs a first reference voltage VREF1; a second reference voltage generator 22 that receives the external voltage EVC, and generates and outputs a second reference voltage VREF2; an internal voltage generator 28 to receive the first reference voltage VREF1 and generate an internal voltage IVC of a constant level for application to an array area of memory cells or to a peripheral area; a controller 32 to output first and second reference voltage switching selection signals to select a reference voltage in response to a reference voltage selection signal supplied to the device; a first switch 24 to supply the first reference voltage VREF1 to a high voltage generator 30 in response to the first reference voltage switching selection signal of the controller 32; a second switch 26 to supply the second reference voltage VREF2 to the high voltage generator 30 in response to the second reference voltage switching selection signal of the controller 32; and the high voltage generator 30 to receive and boost the first reference voltage VREF1 or the second reference voltage VREF2, selected through the first and second switches 24, 26, and generate a first high voltage VPP1 of a first given level or a second high voltage VPP2 of a second given level, and apply it as the word line gate voltage.

With reference to FIG. 2, the operation of the first embodiment will be described in detail, as follows.

The first reference voltage generator 20 receives the external voltage EVC, and generates and outputs the first reference voltage VREF1. The second reference voltage generator 22 receives the external voltage EVC, and generates and outputs the second reference voltage VREF2.

In a normal operating mode, the controller 32 outputs the first reference voltage switching selection signal S1 as a high signal, and outputs the second reference voltage switching selection signal S2 as a low signal, to respectively apply them to selection nodes of the first and second switches 24, 26. Thereby, the first switch 24 is switched On, and the second switch 26 is switched Off. Therefore, the first reference voltage VREF1 output from the first reference voltage generator 20 is applied to the internal voltage generator 28 and the high voltage generator 30. The internal voltage generator 28 receives the first reference voltage VREF1 output from the first reference voltage generator 20, generates the internal voltage IVC of a constant level, and applies it as the memory cell array voltage or the periphery-use voltage. Further, the high voltage generator 30 receives and boosts the first reference voltage VREF1 through the first switch 24, generates the first high voltage VPP1 having a first given voltage level, and applies it as the word line gate voltage.

When a mode signal for changing the high voltage VPP is input to the device through a pad or a fuse option circuit, the controller 32 outputs the first reference voltage switching selection signal S1 as a low signal, and outputs the second reference voltage switching selection signal S2 as a high signal, to respectively apply them to selection nodes of the first and second switches 24, 26. Thereby, the first switch 24 is switched Off, and the second switch 26 is switched On. Therefore, the first reference voltage VREF1 output from the first reference voltage generator 20 is applied to the internal voltage generator 28, and the second reference voltage VREF2 output from the second reference voltage generator 22 is applied to the high voltage generator 30. The internal voltage generator 28 receives the first reference voltage VREF1 output from the first reference voltage generator 20, generates the internal voltage IVC of a constant level, and applies it at the memory cell array area or the peripheral area. Further, the high voltage generator 30 receives and boosts the second reference voltage VREF2 through the second switch 26, generates the second high voltage VPP2 having a second given level, and applies it as the word line gate voltage.

Figure 3:
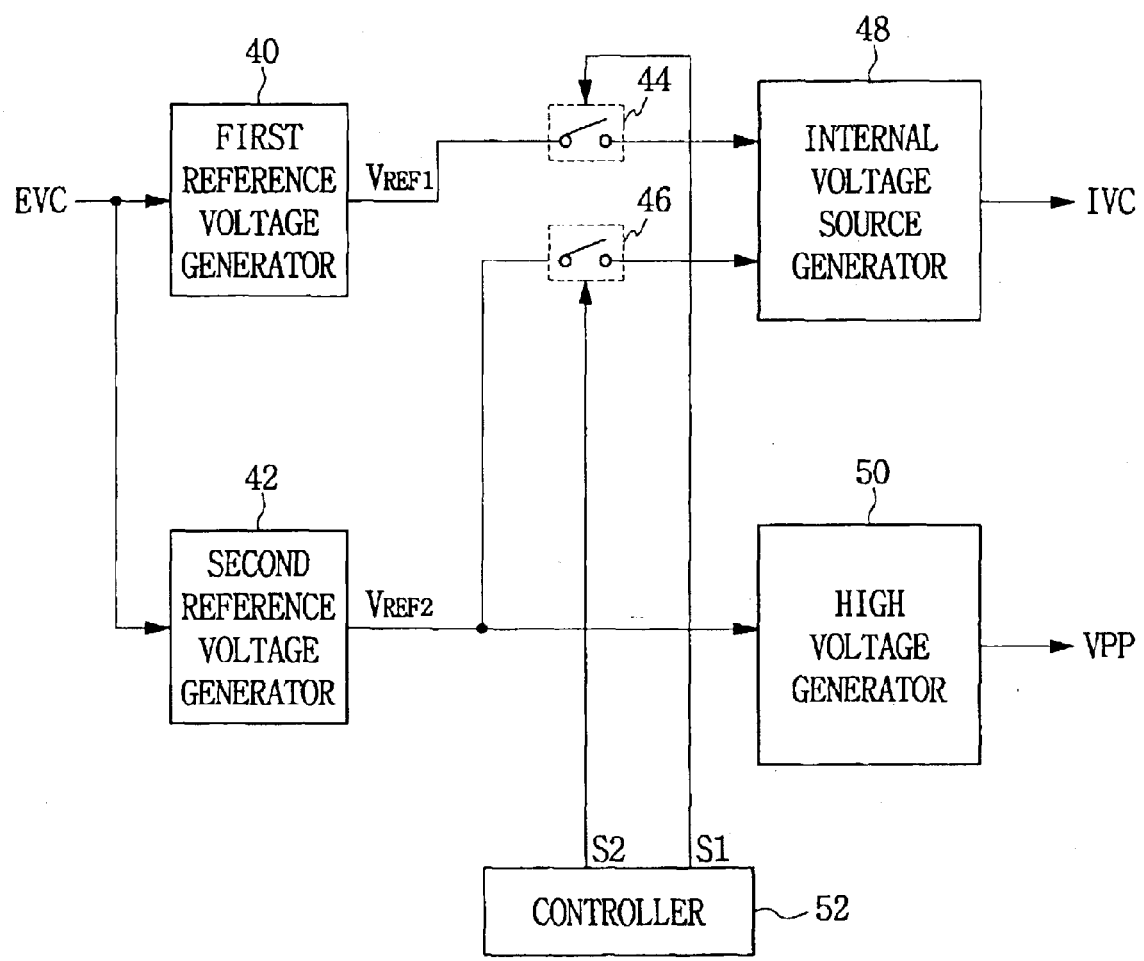
FIG. 3 is a circuit diagram of a circuit for generating an internal voltage and a high voltage in a semiconductor memory device in a second preferred embodiment in accordance with the present invention.

FIG. 3 is a circuit diagram of a circuit for generating an internal voltage and a high voltage in a semiconductor memory device in a second preferred embodiment of the present invention.

The circuit in FIG. 3 is made up of: a first reference voltage generator 40 that receives an external voltage EVC, and generates and outputs a first reference voltage VREF1; a second reference voltage generator 42 that receives the external voltage EVC, and generates and outputs a second reference voltage VREF2; a high voltage generator 50 to receive and boost the second reference voltage VREF2, generate the high voltage VPP of a constant level, and apply it as a gate voltage of a word line; a controller 52 to output first and second reference voltage switching selection signals to select reference voltage in response to a reference voltage selection signal supplied to the device; a first switch 44 to supply the first reference voltage VREF1 to an internal voltage generator 48 in response to the first reference voltage switching selection signal of the controller 52; a second switch 46 for supplying the second reference voltage VREF2 to the internal voltage generator 48 in response to the second reference voltage switching selection signal of the controller 52; and the internal voltage generator 48 to receive the first reference voltage VREF1 or the second reference voltage VREF2 through the first or second swatches 24, 26, generate a first internal voltage IVC1 of a first constant level or a second internal voltage IVC2 of a second constant level, and apply it at a memory cell array area or a peripheral area.

Referring to FIG. 3, the operation of the second preferred embodiment of the present invention will be described in detail, as follows.

The first reference voltage generator 40 receives the external voltage EVC, and generates and outputs the first reference voltage VREF1. The second reference voltage generator 42 receives the external voltage source EVC, and generates and outputs the second reference voltage VREF2.

In a normal operating mode, the controller 52 outputs the first reference voltage switching selection signal SI as a low signal, and outputs the second reference voltage switching selection signal S2 as a high signal, and respectively applies them to selection nodes of the first and second switches 44, 46. Thereby, the first switch 44 is switched Off, and the second switch 46 is switched On. Therefore, the second reference voltage VREF2 output from the second reference voltage generator 42 is applied to the internal voltage generator 48 and the high voltage generator 50. The internal voltage generator 48 receives the second reference voltage VREF2 output from the second reference voltage generator 42, generates the second internal voltage source IVC2 of a second constant level, and applies it at the memory cell array area or the peripheral area. Further, the high voltage generator 50 receives and boosts the second reference voltage VREF2 output from the second reference voltage generator 42, generates the high voltage VPP of a given level, and applies it as the word line gate voltage.

When a mode signal for changing the internal voltage IVC is supplied to the device through a pad or a fuse option circuit, the controller 52 outputs the first reference voltage switching selection signal S1 as a high signal, and outputs the second reference voltage switching selection signal S2 as a low signal, and respectively applies them to selection nodes of the first and second switches 44, 46. Thereby, the first switch 44 is switched On, and the second switch 46 is switched Off. Therefore, the first reference voltage VREF1 output from the first reference voltage generator 40 is applied to the internal voltage generator 48, and the second reference voltage VREF2 output from the second reference voltage generator 42 is applied to the high voltage generator 50. At this time, the internal voltage generator 48 receives the first reference voltage VREF1 output from the first reference voltage generator 40, generates the first internal voltage IVC1 of a first constant level, and applies it at the memory cell array area or the peripheral area. Further, the high voltage generator 50 receives and boosts the second reference voltage VREF2 output from the second reference voltage generator 42, generates the high voltage-VPP of a given level, and applies it as the word line gate voltage.

Figure 4:
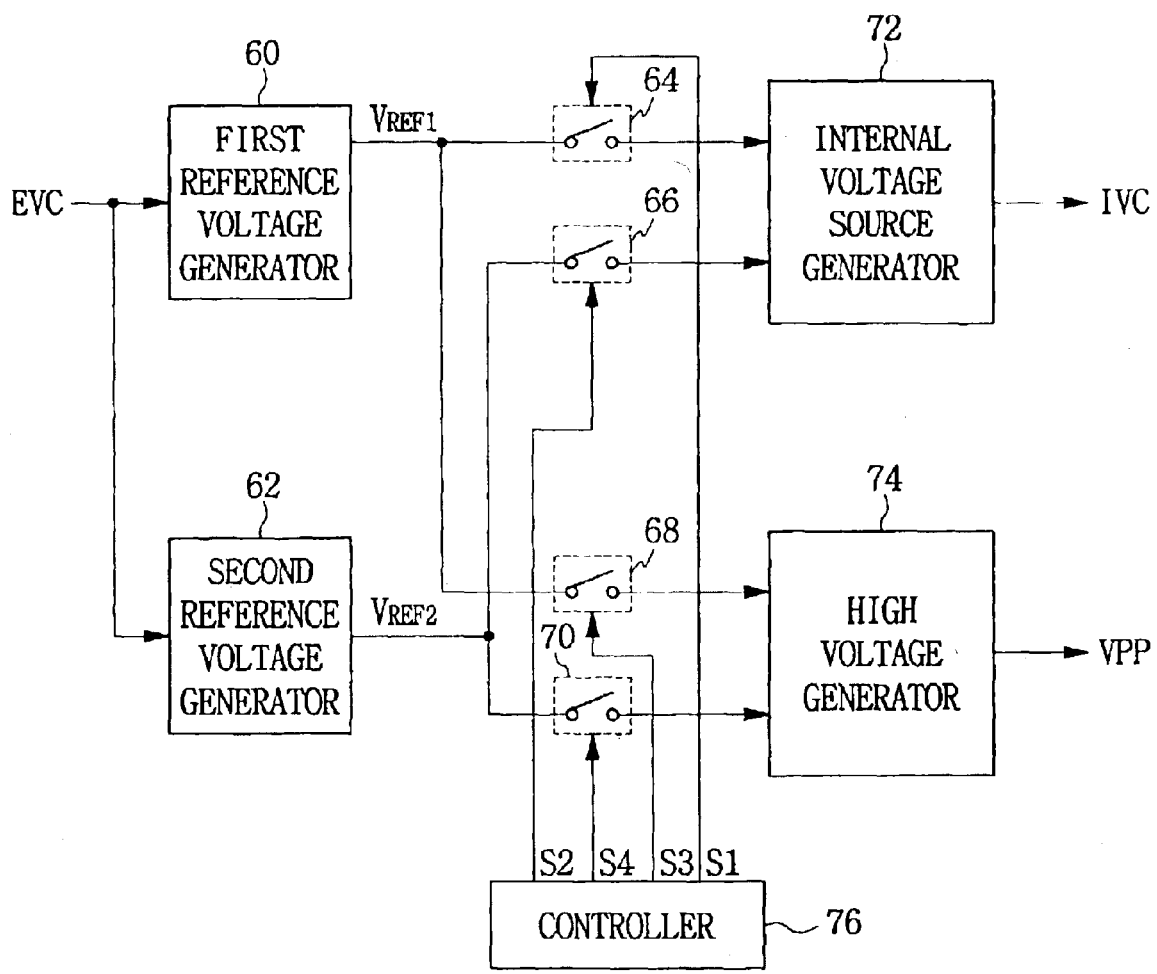
FIG. 4 is a circuit diagram of a circuit for generating an internal voltage and a high voltage in a semiconductor memory device in a third preferred embodiment of the present invention.

FIG. 4 is a circuit diagram of a circuit for generating an internal voltage and a high voltage in a semiconductor memory device in a third preferred embodiment of the present invention.

The circuit in FIG. 4 is composed of: a first reference voltage generator 60 to receive external voltage EVC, and generate and output an first reference voltage VREF1; a second reference voltage generator 62 to receive the external voltage EVC, and generate and output the second reference voltage VREF2; a controller 76 to output first through fourth switching selection signals to select the first or second reference voltage in response to a reference voltage selection signal supplied to the device; a first switch 64 to supply the first reference voltage VREF1 to the internal voltage generator 72 in response to the first switching selection signal S1 output from the controller 76; a second switch 66 to supply the second reference voltage VREF2 to the internal voltage generator 72 in response to the second switching selection signal S2 of the controller 76; a third switch 68 to supply the first reference voltage VREF1 to the high voltage generator 74 in response to a third switching selection signal S3 output from the controller 76; a fourth switch 70 to supply the second reference voltage VREF2 to the high voltage generator 74 in response to a fourth switching selection signal S4 of the controller 76; the internal voltage generator 72 to receive the first reference voltage VREF1 or the second reference voltage VREF2 through the first or second switch 64, 66, generate a first internal voltage IVC1 having a first constant level or a second internal voltage IVC2 having a second constant level, and apply it at the memory cell array area or the peripheral area; and a high voltage generator 74 to receive and boost the first reference voltage VREF1 or the second reference voltage VREF2 through the third or fourth switch 68, 70, and generate first high voltage VPP1 of a first given level or a second high voltage VPP2 of a second given level, and apply it as the word line gate voltage.

With reference to the above-described FIG. 4, the operation of the third preferred embodiment of the present invention will be described in detail, as follows.

The first reference voltage generator 60 receives the external voltage EVC, and generates and outputs the first reference voltage VREF1. The second reference voltage generator 62 receives the external voltage EVC, and generates and outputs the second reference voltage VREF2.

In normal operating mode, the controller 76 outputs the first and third switching selection signals S1, S3 as high signals, and outputs the second and fourth switching selection signals S2, S4 as low signals, and respectively applies them to selection nodes of the first through fourth switches 64, 66, 68, 70. Thereby, the first and third switches 64, 68 are switched On, and the second and fourth switches 66, 70 are switched Off. Therefore, the first reference voltage VREF1 is applied to the internal voltage generator 72 and the high voltage generator 74. The internal voltage generator 72 receives the first reference voltage VREF1 generates the first internal voltage IVC1, and applies it at a memory cell array area or the peripheral area. Further, the high voltage generator 74 receives and boosts the first reference voltage VREF1 generates the high voltage VPP1 and applies it as the word line gate voltage When a mode signal for changing the internal voltage source IVC is supplied to the device through the pad or the fuse option circuit or a mode register set, the controller 76 outputs the first and fourth switching selection signals S1, S4 as low signals, and outputs the second and third switching selection signals S2, S3 as high signals, and respectively applies them to selection nodes of the first through fourth switches 64, 66, 68, 70. Thereby, the first and fourth switches 64, 70 are switched Off, and the second and third switches 66, 68 are switched On. Therefore, the first reference voltage VREF1 is applied to the high voltage generator 74, and the second reference voltage VREF2 is applied to the internal voltage generator 72. At this time, the internal voltage generator 72 receives the second reference voltage VREF2, generates the second internal voltage IVC2, and applies it at the memory cell array area or the peripheral area. Further, the high voltage generator 74 receives and boosts the first reference voltage VREF1, generates the first high voltage VPP1, and applies it as the word line gate voltage.

When a mode signal for changing the high voltage VPP is supplied to the device through the pad or the fuse option circuit, the controller 76 outputs the first and fourth switching selection signals S1, S4 as high signals, and outputs the second and third switching selection signals S2, S3 as low signals, and respectively applies them to selection nodes of the first through fourth switches 64, 66, 68, 70. Thereby, the first and fourth switches 64, 70 are switched On, and the second and third switches 66, 68 are switched Off. Therefore, the first reference voltage VREF1 is applied to the internal voltage generator 72, and the second reference voltage VREF2 is applied to the high voltage generator 74. At this time, the internal voltage generator 72 receives the first reference voltage VREF1, generates the internal voltage IVC1, and applies it at the memory cell array area or the peripheral area. Further, the high voltage generator 74 receives and boosts the second reference voltage VREF2 generates the second high voltage VPP2, and applies it as the word line gate voltage.

When a mode signal for changing both the internal voltage IVC and the high voltage VPP is supplied to the device through the pad or the fuse option circuit, the controller 76 outputs the first and third switching selection signals S1, S3 as low signals, and outputs the second and fourth switching selection signals S2, S4 as high signals, and respectively applies them to selection nodes of the first through fourth switches 64, 66, 68, 70. Thereby, the second and fourth switches 66, 70 are switched on, and the first and third switches 64, 68 are switched Off. Therefore, the second reference voltage VREF2 is applied to the internal voltage generator 72 and the high voltage generator 74. At this time, the internal voltage generator 72 receives the second reference voltage VREF2, generates the internal voltage IVC2, and applies it at the memory cell array area or the peripheral area. Further, the high voltage generator 74 receives and boosts the second reference voltage VREF2, generates the second high voltage VPP2, and applies it as the word line gate voltage.

In the above-described first through third embodiments of the present invention, two reference voltage generators are used to generate the mutually different first and second reference voltages so as to change the internal voltage IVC and the high voltage VPP by using the mutually different reference voltage. It is generally valid, however, to embody the present invention using two or more reference voltage generators, so as to perform a selection so that one out of two or more reference voltages is input to an internal voltage generator and/or a high voltage generator, without deviating from the scope of the invention.

As afore-mentioned, in accordance with embodiments of the present invention, in order to perform a test or separately change an internal voltage and high voltage, two reference voltage generators are equipped in a semiconductor memory device, and a reference voltage changing mode signal is supplied to the device through a pad or a fuse option circuit so as to select a reference voltage. When, the internal voltage or the high voltage is changed, advantages can be realized because the internal voltage and the high voltage can be separately set and respective corresponding specific defects can be eliminated.

In embodiments of the present invention, there are further advantages such as a change of reference voltage can make the internal voltage source or the high voltage different in a testing environment, to thereby improve production cost and shorten a development period.

It will be apparent to those skilled in the art that various other modifications and variations can be made to the embodiments without deviating from the spirit or scope of the invention. Thus, it is intended that the present invention cover the modifications and variations of this invention provided they come within the scope of the appended claims and their equivalents.

What is claimed is:

1. A circuit for selecting reference voltages in a semiconductor memory device having an internal voltage generator for receiving the reference voltage and generating an internal voltage of a constant level, and having a high voltage generator for receiving and boosting the reference voltage and generating a high voltage of a given level, said circuit comprising:

a first reference voltage generator to generate a first predetermined reference voltage, from a supplied external voltage;

a second reference voltage generator to generate a second predetermined reference voltage, from the supplied external voltage;

a controller to output first and second reference voltage switching selection signals, to select the reference voltage in response to a reference voltage selection signal supplied to the device;

a first switch to supply the first reference voltage to the high voltage generator in response to the first reference voltage switching selection signal; and a second switch to supply the second reference voltage to the high voltage generator in response to the second reference voltage switching selection signal.

2. The circuit of claim 1, wherein said controller receives the reference voltage selection signal through a pad.

3. The circuit of claim 1, wherein said controller receives the reference voltage selection signal through a fuse option circuit.

4. A circuit for selecting reference voltages in a semiconductor memory device having an internal voltage generator for receiving the reference voltage and generating an internal voltage source of constant level, and having a high voltage generator for receiving and boosting the reference voltage and generating a high voltage of a given level, said circuit comprising:

a first reference voltage generator to generate a first predetermined reference voltage, from a supplied external voltage;

a second reference voltage generator to generate a second predetermined reference voltage, in response to a supply of the external voltage;

a controller to output first and second reference voltage switching selection signals, to select the reference voltage in response to a reference voltage selection signal supplied to the device;

a first switch to supply the first reference voltage to the internal voltage generator in response to the first reference voltage switching selection signal; and a second switch to supply the second reference voltage to the internal voltage generator in response to the second reference voltage switching selection signal.

5. The circuit of claim 4, wherein said controller receives the reference voltage selection signal through a pad.

6. The circuit of claim 4, wherein said controller receives the reference voltage selection signal through a fuse option circuit.

7. A circuit for selecting reference voltages in a semiconductor memory device having an internal voltage generator for receiving the reference voltage and generating an internal voltage of a constant level, and having a high voltage generator for receiving and boosting the reference voltage and generating a high voltage of a given level, said circuit comprising:

a first reference voltage generator to generate a first predetermined reference voltage, from a supplied external voltage;

a second reference voltage generator to generate a second predetermined reference voltage, from the supplied external voltage;

a controller to output first through fourth switching selection signals, to select the first or second reference voltage in response to a reference voltage selection signal supplied to the device;

a first switch to supply the first reference voltage to the internal voltage generator in response to the first switching selection signal;

a second switch to supply the second reference voltage to the internal voltage generator in response to the second switching selection signal;

a third switch to supply the first reference voltage to the high voltage generator in response to the third switching selection signal; and a fourth switch to supply the second reference voltage to the high voltage generator in response to the fourth switching selection signal.

8. The circuit of claim 7, wherein said controller receives the reference voltage selection signal through a pad.

9. The circuit of claim 7, wherein said controller receives the reference voltage selection signal through a fuse option circuit.

10. The circuit of claim 7, wherein said controller receives the reference voltage selection signal through a made register set node.

11. A method of selecting reference voltages in a semiconductor memory device that has a plurality of reference voltage generators for generating first and second reference voltages, an internal voltage generator for receiving the first or second reference voltage and generating an internal voltage source of a constant level, and a high voltage generator for receiving and boosting the first or second reference voltage and generating a high voltage of a given level, said method comprising the step of:

selecting one reference voltage out of the first and second reference voltages to input to the high voltage generator in response to a reference voltage selection signal supplied to the device.

12. The method of claim 11, further comprising selecting one reference voltage out of the first and second reference voltages to input to the internal voltage generator in response to the reference voltage selection signal.

13. The method of claim 11, wherein said reference voltage selection signal is input to the device through a pad.

14. The method of claim 11, wherein said reference voltage selection signal is input to the device through a fuse option circuit.

15. The method of claim 11, wherein said reference voltage selection signal is input to the device through a mode register set node.

16. An internal voltage supply circuit in a semiconductor memory device, the circuit comprising:

a plurality of reference voltage generators;

an internal voltage generator to generate a first internal supply voltage based on a supplied reference voltage;

an internal high voltage generator to generate a second internal supply voltage, higher than the first internal supply voltage, based on a supplied reference voltage; and control circuitry to supply different combinations of reference voltage generator output to the internal voltage generator and the internal high voltage generator, depending on a reference voltage selection signal supplied to the device.

* * * * *

UNITED STATES PATENT AND TRADEMARK OFFICE
CERTIFICATE OF CORRECTION

PATENT NO. : 6,876,585 B2 Page 1 of 1
APPLICATION NO. : 10/612593
DATED : April 5, 2005
INVENTOR(S) : Choi et al.

It is certified that error appears in the above-identified patent and that said Letters Patent is hereby corrected as shown below:

Column 5, line 59, please replace "signal SI" with --signal S1--
Column 6, line 28, please replace "voltage-VPP" with --voltage VPP--
Column 7, line 24, please replace "voltage" with --voltage.--
Column 10, line 18, please replace "made" with --mode--

Signed and Sealed this

Twenty-first Day of November, 2006

JON W. DUDAS
*Director of the United States Patent and Trademark Office*